United States Patent
Han et al.

(10) Patent No.: US 7,170,225 B2
(45) Date of Patent: Jan. 30, 2007

(54) FLAT PANEL DISPLAY FOR DISPLAYING SCREENS AT BOTH SIDES

(75) Inventors: Dong-Won Han, Suwon-si (KR); Byung-Hee Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 89 days.

(21) Appl. No.: 10/980,338

(22) Filed: Nov. 4, 2004

(65) Prior Publication Data

US 2005/0110403 A1    May 26, 2005

(30) Foreign Application Priority Data

Nov. 12, 2003   (KR)   .................... 10-2003-0079945

(51) Int. Cl.
*H01J 1/62* (2006.01)
*H01J 63/04* (2006.01)

(52) U.S. Cl. ...................... 313/504; 313/503
(58) Field of Classification Search ............... 313/504, 313/503, 506, 509, 512
See application file for complete search history.

(56) References Cited

U.S. PATENT DOCUMENTS

2004/0075628 A1*   4/2004   Chien et al. .................. 345/82
2004/0113545 A1*   6/2004   Pang et al. .................. 313/504
2004/0263064 A1*  12/2004   Huang ........................ 313/504
2005/0040756 A1*   2/2005   Winters et al. ............. 313/504

* cited by examiner

*Primary Examiner*—Joseph Williams
*Assistant Examiner*—Bumsuk Won
(74) *Attorney, Agent, or Firm*—Robert E. Bushnell, Esq.

(57) ABSTRACT

A flat panel display comprises: a transparent substrate having a first display portion and a second display portion; at least one first organic light emitting diode positioned in the first display portion for emitting light in a first direction perpendicular to the transparent substrate, and having a first lower electrode, a first upper electrode, and a first organic emission layer interposed between the first lower electrode and the first upper electrode; and at least one second organic light emitting diode positioned in the second display portion for emitting light in a second direction opposite to the first direction, and having a second lower electrode, a second upper electrode, and a second organic emission layer interposed between the second lower electrode and the second upper electrode. As a result, the flat panel display is fabricated using one substrate to display both screens such that one of the screens is displayed while the other is not displayed. Accordingly, the thickness of electronic equipment employing the flat panel display may be reduced, and the power consumption of the electronic equipment may also be reduced.

12 Claims, 9 Drawing Sheets

FLAT PANEL DISPLAY FOR DISPLAYING SCREENS AT BOTH SIDES

CLAIM OF PRIORITY

This application makes reference to, incorporates the same herein, and claims all benefits accruing under 35 U.S.C. §119 from an application for FLAT PANEL DISPLAY FOR DISPLAYING SCREENS AT BOTHSIDES earlier filed in the Korean Intellectual Property Office on 12 Nov. 2003 and there duly assigned Ser. No. 2003-79945.

BACKGROUND OF THE INVENTION

1. Technical Field

The present invention relates to a flat panel display and, more particularly, to a flat panel display capable of displaying screens at both sides.

2. Related Art

Examples of electronic equipment employing a flat panel display include a mobile phone, a camcorder, a notebook computer, and so forth. One popular example of them is a folder type mobile phone, which has external and internal screens on external and internal surfaces of its cover, respectively, so that detailed information may be checked through the internal screen in its unfolded state and simple information may also be checked through the external screen in its folded state.

The representative flat panel display used for the mobile phone includes a liquid crystal display and an organic electroluminescence display, and a liquid crystal display panel should be separately inserted into the external and internal screens in order to fabricate the mobile phone with external and internal screens using the liquid crystal display. This causes the thickness of the mobile phone to be increased.

To deal with the above-mentioned problem, there have been attempts to fabricate the mobile phone having internal and external screens by means of a transparent organic light-emitting display. The transparent organic light-emitting display is an emissive display that does not require a backlight, and may advantageously display both screens with only one panel so as to reduce the thickness of the mobile phone having internal and external screens. However, the transparent organic light-emitting display presents screen displays on both sides at the same time, so that it displays the internal screen in addition to the external screen even when only the external screen of the mobile phone is used, which causes power consumption to be significantly increased.

SUMMARY OF THE INVENTION

The present invention solves the aforementioned problems associated with conventional devices by providing a flat panel display for displaying internal and external screens while reducing power consumption as well as the thickness of the electronic equipment.

In an exemplary embodiment of the present invention, the flat panel display for displaying screens on both sides includes: a transparent substrate having a first display portion and a second display portion; at least one first organic light emitting diode positioned in the first display portion for emitting light in at least a first direction perpendicular to the transparent substrate, and having a first lower electrode, a first upper electrode, and a first organic emission layer interposed between the first lower electrode and the first upper electrode; and at least one second organic light emitting diode positioned in the second display portion for emitting light in a second direction opposite to the first direction, and having a second lower electrode, a second upper electrode, and a second organic emission layer interposed between the second lower electrode and the second upper electrode.

The first and second organic light emitting diodes may be positioned on the same surface of the transparent substrate. In this case, in the first organic light emitting diode, the first lower electrode may be a reflective electrode and the first upper electrode may be a transparent electrode. In the second organic light emitting diode, the second lower electrode may be a transparent electrode and the second upper electrode may be a reflective electrode. In the meantime, both the first lower electrode and the first upper electrode may be a transparent electrode in the first organic light emitting diode, and the second lower electrode may be a transparent electrode and the second upper electrode may be a reflective electrode in the second organic light emitting diode. Alternatively, both the first lower electrode and the first upper electrode maybe a transparent electrode in the first organic light emitting diode, and the second lower electrode may be a reflective electrode and the second upper electrode may be a transparent electrode in the second organic light emitting diode.

Conversely, the first organic light emitting diode may be positioned on a surface opposite to a surface on which the second organic light emitting diode is positioned. In this case, in the first organic light emitting diode, the first lower electrode may be a transparent electrode and the first upper electrode may be a reflective electrode. In the second organic light emitting diode, the second lower electrode may be a transparent electrode and the second upper electrode may be a reflective electrode. Alternatively, the first lower electrode may be a reflective electrode and the first upper electrode may be a transparent electrode in the first organic light emitting diode, and the second lower electrode may be a reflective electrode and the second upper electrode may be a transparent electrode in the second organic light emitting diode.

The flat panel display may be used for a folder type mobile phone.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein.

Figure 1:
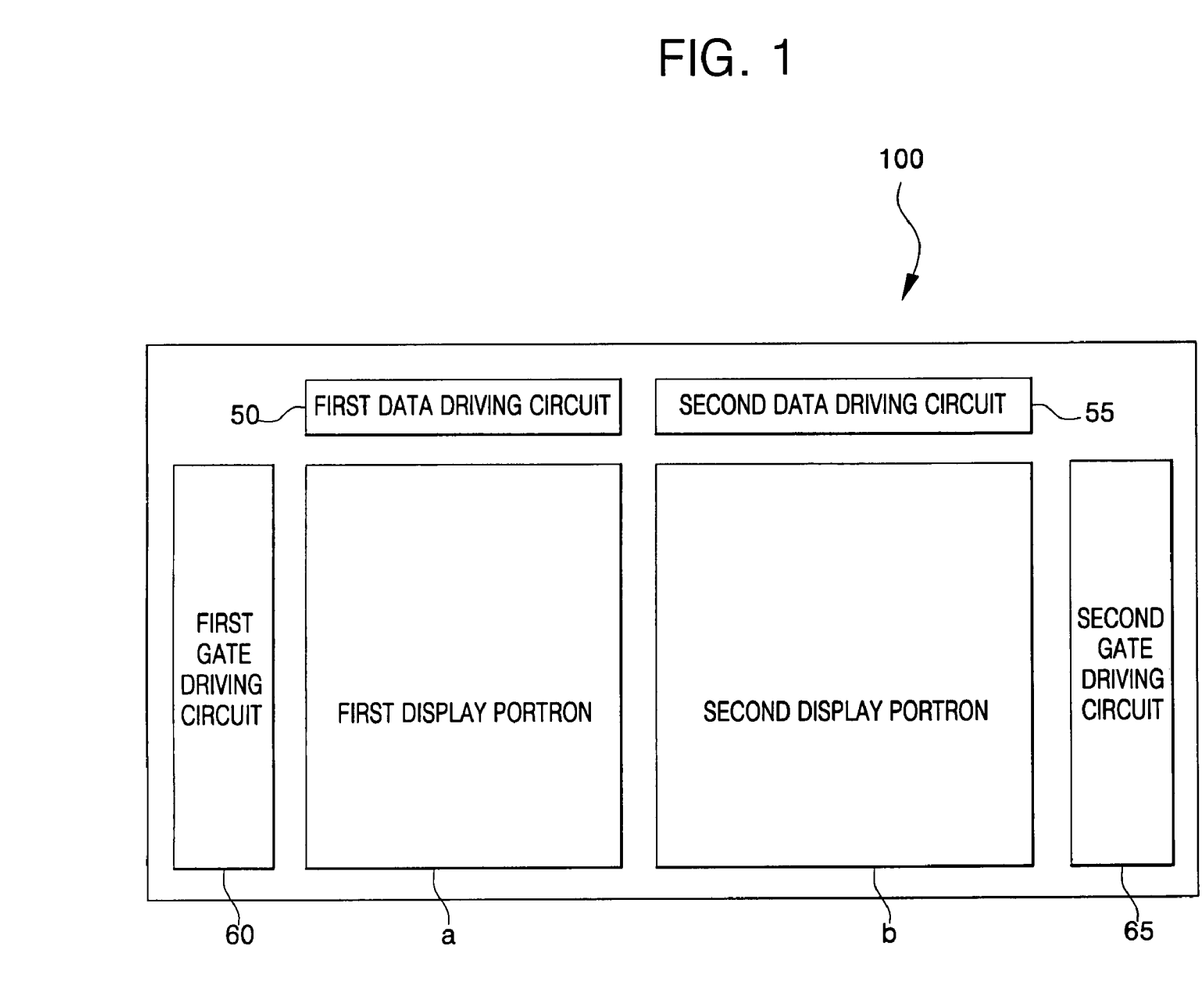
FIG. 1 is a plan view illustrating a flat panel display in accordance with any one of the first to eighth embodiments of the present invention.

FIG. 1 is a plan view illustrating a flat panel display in accordance with any one of the first to eighth embodiments of the present invention.

Referring to FIG. 1, a substrate 100 has a first display portion (a) and a second display portion (b). The second display portion (b) is spaced apart from the first display portion (a). Each of the first display portion (a) and the second display portion (b) has at least one unit pixel (not shown). The unit pixel (not shown) has an organic light emitting diode (OLED), and the OLED positioned in the first display portion (a) is referred to as a first OLED, and the OLED positioned in the second display portion (b) is referred to as a second OLED.

The first OLED and the second OLED may be positioned on the same surface, for example, on a top surface of the substrate 100. Alternatively, one of the first OLED and the second OLED may be positioned on the top surface of the substrate 100 and the other may be positioned on a bottom surface of the substrate 100.

The first display portion (a) emits light in a direction different from that of the second display portion (b). Accordingly, when both the first display portion (a) and the second display portion (b) are positioned on the top surface of the substrate 100, the first OLED positioned in the first display portion (a) may be a transparent type for emitting light in a direction perpendicular to the substrate 100, namely, in a direction toward the substrate and in a direction away from the substrate, and the second OLED positioned in the second display portion (b) may be a bottom-emission type for emitting light in a direction toward the substrate (first and seventh embodiments). Alternatively, the first OLED may be a transparent type for emitting light in a direction toward the substrate and in a direction away from the substrate, and the second OLED may be a top-emission type for emitting light in a direction away from the substrate (second and eighth embodiments). Alternatively, the first OLED may be a top-emission type for emitting light in a direction away from the substrate and the second OLED may be a bottom-emission type for emitting light in a direction toward the substrate (third and ninth embodiments). Accordingly, a flat panel display capable of displaying screens at both sides, namely, in a direction toward the substrate and in a direction away from the substrate, may be obtained.

Alternatively, when one of the first display portion (a) and the second display portion (b) is positioned on the top surface of the substrate 100 and the other is positioned on the bottom surface of the substrate 100, both the first OLED and the second OLED positioned on the first display portion (a) and the second display portion (b), respectively, may be bottom-emission types for emitting light in a direction toward the substrate (fourth embodiment). Meanwhile, both the first OLED and the second OLED positioned on the first display portion (a) and the second display portion (b), respectively, may be top-emission types for emitting light in a direction away from the substrate (fifth embodiment). Accordingly, a flat panel display capable of displaying both screens in directions opposite to each other may be obtained. In addition, at least one of the first display portion (a) and the second display portion (b) is a top-emission type or a bottom-emission type for displaying a screen in only one direction, and therefore the top-emission type or the bottom-emission type does not need to be driven when the screen is displayed in a direction opposite to the one direction, which leads to a reduction in power consumption. As a result, a flat panel display for displaying screens at both sides may be implemented while power consumption may also be reduced.

The first OLED positioned in the first display portion (a) and the second OLED positioned in the second display portion (b) may be driven by an external driving circuit externally mounted by means of Tape Carrier Package (TCP), Chip on Glass (COG), or Chip on Film (COF). Conversely, as shown in FIG. 1, the first OLED may be driven by a first data driving circuit 50 and a first gate driving circuit 60 positioned in a peripheral region of the first display portion (a), and the second OLED maybe driven by a second data driving circuit 55 and a second gate driving circuit 65 positioned in a peripheral region of the second display portion (b).

Figure 2:
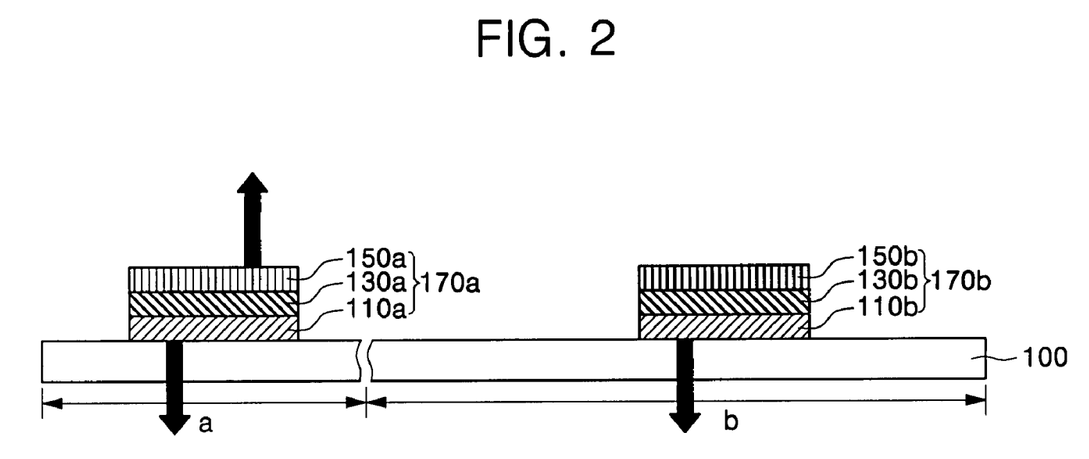
FIGS. 2 to 6 are cross-sectional views illustrating a method for fabricating a flat panel display in accordance with the first to fifth embodiments of the present invention, respectively.

FIG. 2 is a cross-sectional view illustrating a method for fabricating a flat panel display in accordance with the first embodiment of the present invention. The flat panel display in accordance with the first embodiment is fabricated to include both a transparent OLED (TOLED) and a bottom-emission OLED on one substrate.

Referring to FIG. 2, a transparent substrate 100 having a first display portion (a) and a second display portion (b) is provided. The transparent substrate 100 may be a glass substrate or a plastic substrate. At least one first lower electrode 110a and at least one second lower electrode 110b are formed on the first display portion (a) and the second display portion (b), respectively. The lower electrodes 110a and 110b are transparent electrodes, and, for example, Indium Tin Oxide (ITO) or Indium Zinc Oxide (IZO) is used for the lower electrodes when they are anodes. A first organic emission layer 130a and a second organic emission layer 130b are formed on the first and second lower electrodes 110a and 110b, respectively. A first upper electrode 150a and a second upper electrode 150b are formed on the first and second organic emission layers 130a and 130b, respectively. The first upper electrode 150a is a transparent electrode, and a thin metal layer having a low work function, for example, Mg, Ca, Al, Ag, Ba, or an alloy thereof, is used to form the first upper electrode having a thickness of 100 Å or less when it is a cathode. Forming the first upper electrode 150a may further include forming an ITO layer on the thin metal layer. The second upper electrode 150b is a reflective electrode, and a metal layer having a low work function, for example, Mg, Ca, Al, Ag, Ba, or an alloy thereof, is used to form the second upper electrode having a thickness of 500 Å or more when it is a cathode. The first upper electrode 150a as the transparent electrode and the second upper electrode 150b as the reflective electrode may each be formed using a shadow mask or the like.

As a result, at least one first OLED 170a and at least one second OLED 170b are formed in the first display portion (a) and the second display portion (b), respectively. The first OLED 170*a* is a transparent type in which the first lower electrode 110*a* and the first upper electrode 150*a* are transparent electrodes to emit light in a direction toward the substrate and in a direction away from the substrate, and the second OLED 170*b* is a bottom-emission type in which the second lower electrode 110*b* is a transparent electrode and the second upper electrode 150*b* is a reflective electrode to emit light only in a direction toward the substrate. Accordingly, the substrate 100 may be used to display both screens, namely, in a direction toward the substrate and in a direction away from the substrate, and the second OLED 170*b* is not driven when the screen is displayed in a direction away from the substrate, thereby reducing its power consumption.

Furthermore, the OLEDs 170*a* and 170*b* maybe passive matrix types or active matrix types. When the OLEDs 170*a* and 170*b* are the active matrix types, the substrate 100 has thin film transistors to be electrically connected to the lower electrodes 110*a* and 110*b*, respectively.

Figure 3:
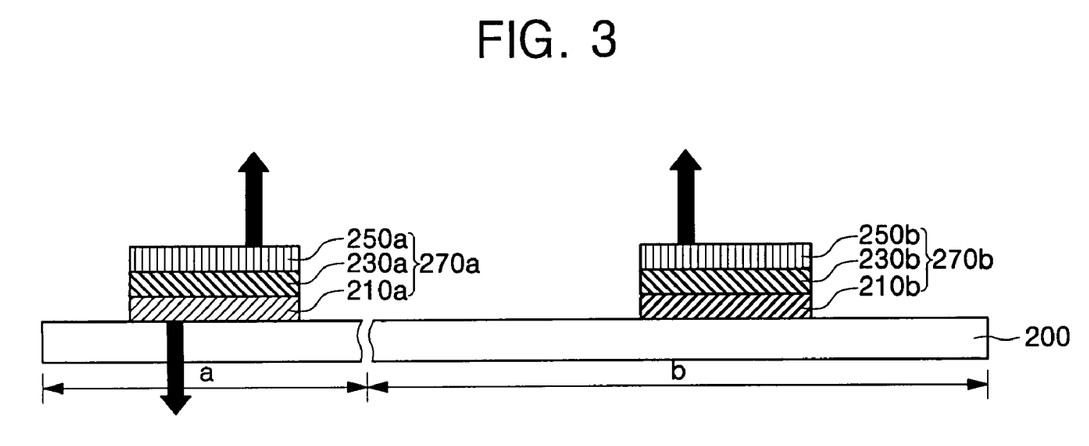

FIG. 3 is a cross-sectional view illustrating a method for fabricating a flat panel display in accordance with the second embodiment of the present invention. The flat panel display in accordance with the second embodiment is fabricated to include both a transparent OLED and a top-emission OLED on one substrate.

Referring to FIG. 3, a transparent substrate 200 having a first display portion (a) and a second display portion (b) is provided. The transparent substrate 200 may be a glass substrate or a plastic substrate. At least one first lower electrode 210*a* and at least one second lower electrode 210*b* are formed on the first display portion (a) and the second display portion (b), respectively. The first lower electrode 210*a* is a transparent electrode, and, for example, ITO or IZO is used for the first lower electrode when it is an anode. The second lower electrode 210*b* is a reflective electrode, and, for example, Ag, Al, Ni, Pt, Pd, or an alloy thereof is used for the second lower electrode when it is an anode. As such, forming the first lower electrode 210*a* and the second lower electrode 210*b* of different respective materials may be carried out by repeatedly performing patterning using photoresist and deposition, or by deposition using a shadow mask.

A first organic emission layer 230*a* and a second organic emission layer 230*b* are formed on the first and second lower electrodes 210*a* and 210*b*, respectively. A first upper electrode 250*a* and a second upper electrode 250*b* are formed on the first and second organic emission layers 230*a* and 230*b*, respectively. The upper electrodes 250*a* and 250*b* are transparent electrodes, and a thin metal layer having a low work function, for example, Mg, Ca, Al, Ag, Ba, or an alloy thereof, is used to form the upper electrodes having a thickness of 100 Å or less when they are cathodes. Forming the upper electrodes 250*a* and 250*b* may further include forming an ITO layer on the thin metal layer.

As a result, at least one first OLED 270*a* and at least one second OLED 270*b* are formed in the first display portion (a) and the second display portion (b), respectively. The first OLED 270*a* is a transparent OLED in which the first lower electrode 210*a* and the first upper electrode 250*a* are transparent electrodes to emit light in a direction toward the substrate and in a direction away from the substrate, and the second OLED 270*b* is a top-emission type in which the second lower electrode 210*b* is a reflective electrode and the second upper electrode 250*b* is a transparent electrode to emit light only in a direction away from the substrate. Accordingly, the substrate 100 may be used to display both screens, namely, in a direction toward the substrate and in a direction away from the substrate, and the second OLED 270*b* is not driven when the screen is displayed in a direction toward the substrate, thereby reducing its power consumption.

Furthermore, the OLEDs 270*a* and 270*b* may be passive matrix types or active matrix types. When the OLEDs 270*a* and 270*b* are the active matrix types, the substrate 100 has thin film transistors to be electrically connected to the lower electrodes 210*a* and 210*b*, respectively.

Figure 4:
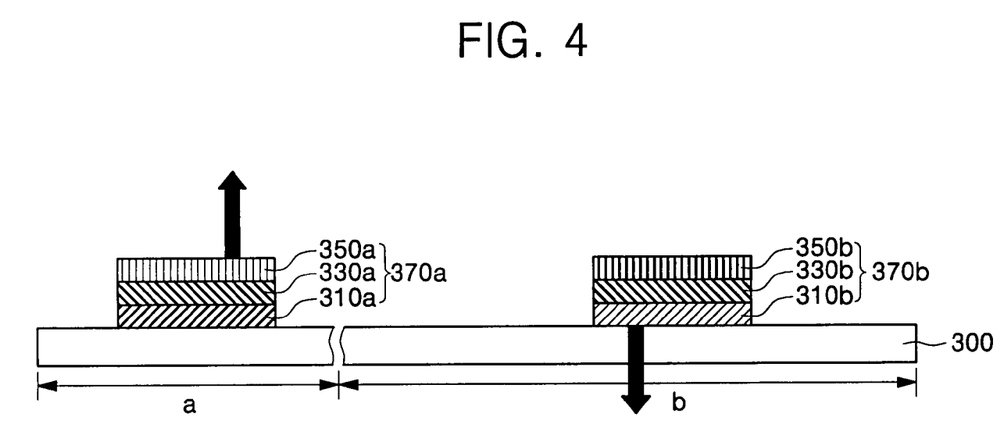

FIG. 4 is a cross-sectional view illustrating a method for fabricating a flat panel display in accordance with the third embodiment of the present invention. The flat panel display in accordance with the third embodiment is fabricated to include both a top-emission OLED and a bottom-emission OLED on one substrate.

Referring to FIG. 4, a transparent substrate 300 having a first display portion (a) and a second display portion (b) is provided. The transparent substrate 300 maybe a glass substrate or a plastic substrate. At least one first lower electrode 310*a* and at least one second lower electrode 310*b* are formed on the first display portion (a) and the second display portion (b), respectively. The first lower electrode 310*a* is a reflective electrode, and, for example, Ag, Al, Ni, Pt, or Pd is used for the first lower electrode when it is an anode. The second lower electrode 310*b* is a transparent electrode, and, for example, ITO or IZO is used for the second lower electrode when it is an anode. As such, forming the first lower electrode 310*a* and the second lower electrode 310*b* of different respective materials may be carried out by repeatedly performing patterning using photoresist and deposition, or by deposition using a shadow mask.

A first organic emission layer 330*a* and a second organic emission layer 330*b* are formed on the first and second lower electrodes 310*a* and 310*b*, respectively. A first upper electrode 350*a* and a second upper electrode 350*b* are formed on the first and second organic emission layers 330*a* and 330*b*, respectively. The first upper electrode 350*a* is a transparent electrode, and a thin metal layer having a low work function, for example, Mg, Ca, Al, Ag, Ba, or an alloy thereof, is used to form the first upper electrode 350*a* having a thickness of 100 Å or less when it is a cathode. Forming the first upper electrode 350*a* may further include forming an ITO layer on the thin metal layer. The second upper electrode 350*b* is a reflective electrode, and a metal layer having a low work function, for example, Mg, Ca, Al, Ag, Ba, or an alloy thereof, is used to form the second upper electrode having a thickness of 500Å or more when it is a cathode. The first upper electrode 350*a* as the transparent electrode and the second upper electrode 350*b* as the reflective electrode may be formed using a shadow mask or the like, respectively.

As a result, at least one first OLED 370*a* and at least one second OLED 370*b* are formed in the first display portion (a) and the second display portion (b), respectively. The first OLED 370*a* is a top-emission type in which the first lower electrode 310*a* is a reflective electrode and the first upper electrode 350*a* is a transparent electrode to emit light in a direction away from the substrate, and the second OLED 370*b* is a bottom-emission type in which the second lower electrode 310*b* is a transparent electrode and the second upper electrode 350*b* is a reflective electrode to emit light in a direction toward the substrate. Accordingly, the substrate 300 may be used to display both screens, namely, in a direction toward the substrate and in a direction away from the substrate, and the first OLED 370*a* or the second OLED 370*b* is not driven when one of the screens is displayed, thereby reducing its power consumption.

Furthermore, the OLEDs 370a and 370b maybe passive matrix types or active matrix types. When the OLEDs 370a and 370b are active matrix types, the substrate 300 has thin film transistors to be electrically connected to the lower electrodes 310a and 310b, respectively.

Figure 5:
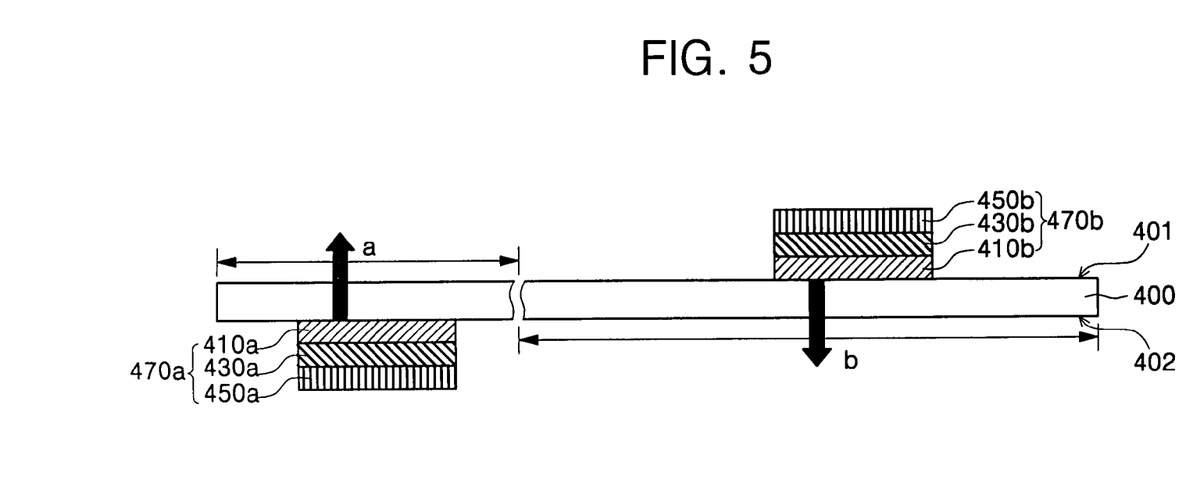

FIG. 5 is a cross-sectional view illustrating a method for fabricating a flat panel display in accordance with the fourth embodiment of the present invention. The flat panel display in accordance with the fourth embodiment is fabricated to include at least one bottom-emission OLED on top and bottom surfaces, respectively, of one substrate.

Referring to FIG. 5, a transparent substrate 400 having a first display portion (a) and a second display portion (b) is provided. The transparent substrate 400 may be a glass substrate or a plastic substrate, and has a top surface 401 and a bottom surface 402. At least one first lower electrode 410a is formed on the bottom surface 402 of the substrate 100 in the first display portion (a). The first lower electrode 410a is made of a transparent electrode, and, for example, ITO or IZO is used for the first lower electrode when it is an anode. A first organic emission layer 430a is formed on the first lower electrode 410a, and a first upper electrode 450a is formed on the first organic emission layer 430a. The first upper electrode 450a is a reflective electrode, and a metal layer having a low work function, for example, Mg, Ca, Al, Ag, Ba, or an alloy thereof, is used to form the first upper electrode having a thickness of 500Å or more when it is a cathode. As a result, at least one first OLED 470a is formed in the first display portion (a).

Next, at least one second lower electrode 410b is formed on the top surface 401 of the substrate 100 in the second display portion (b). The second lower electrode 410b is a transparent electrode, and, for example, ITO or IZO is used for the second lower electrode when it is an anode. A first organic emission layer 430b is formed on the second lower electrode 410b, and a first upper electrode 450b is formed on the first organic emission layer 430b. The first upper electrode 450b is a reflective electrode, and a metal layer having a low work function, for example, Mg, Ca, Al, Ag, Ba, or an alloy thereof, is used to form the first upper electrode having a thickness of 500 Å or more when it is a cathode. As a result, at least one second OLED 470b is formed in the second display portion (b).

Alternatively, the lower electrodes 410a and 410b are formed in the first display portion (a) and the second display portion (b), respectively, the organic emission layers 430a and 430b are formed on the lower electrodes 410a and 410b, respectively, and then the upper electrodes 450a and 450b are formed on the organic emission layers 430a and 430b, respectively, so that the first OLED 470a and the second OLED 470b are formed.

The OLEDs 470a and 470b may be bottom-emission types in which the lower electrodes 410a and 410b are transparent electrodes and the upper electrodes 450a and 470b are reflective electrodes to emit light in a direction toward the substrate. However, the first OLED 470a may be formed on the bottom surface 402 of the substrate while the second OLED 470b may be formed on the top surface 401 of the substrate to thereby fabricate a flat panel display for emitting light in directions opposite to each other. Accordingly, the substrate 400 may be used to display both screens, namely, in a direction toward the substrate and in a direction away from the substrate, and the first OLED 470a or the second OLED 470b is not driven when one screen is displayed in any one of the directions, thereby reducing power consumption.

Furthermore, the OLEDs 470a and 470b may be passive matrix types or active matrix types. When the OLEDs 470a and 470b are active matrix types, the substrate 100 has thin film transistors to be electrically connected to the lower electrodes 410a and 410b, respectively.

Figure 6:
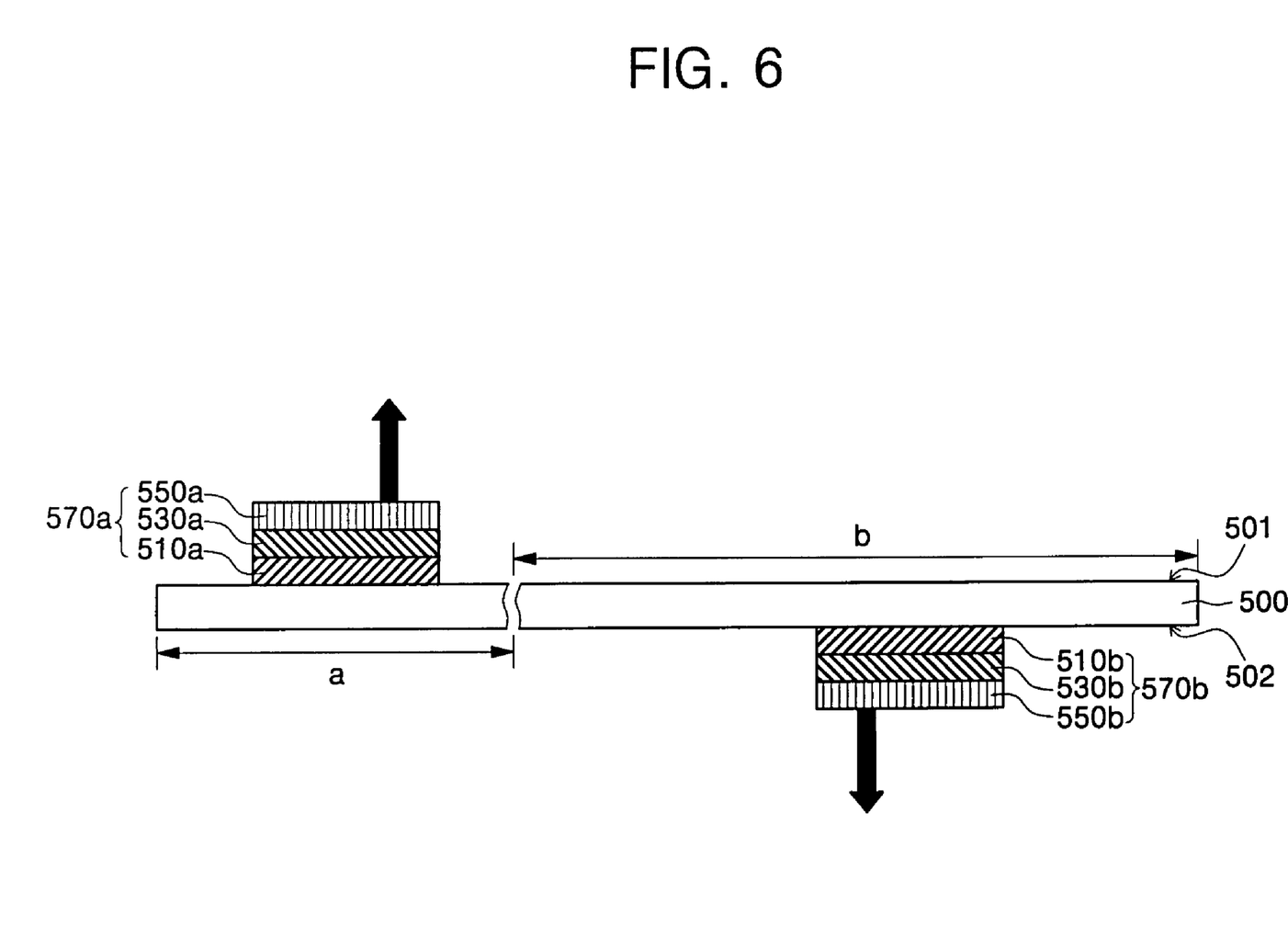

FIG. 6 is a cross-sectional view illustrating a method for fabricating a flat panel display in accordance with the fifth embodiment of the present invention. The flat panel display in accordance with the fifth embodiment is fabricated to include at least one top-emission OLED on top and bottom surfaces, respectively, of one substrate.

Referring to FIG. 6, a transparent substrate 500 having a first display portion (a) and a second display portion (b) is provided. The transparent substrate 500 may be a glass substrate or a plastic substrate, and has a top surface 501 and a bottom surface 502. At least one first lower electrode 510a is formed on the top surface 501 of the substrate 500 in the first display portion (a). The first lower electrode 510a is a reflective electrode, and, for example, Ag, Al, Ni, Pt, or Pd is used for the first lower electrode when it is an anode. A first organic emission layer 530a is formed on the first lower electrode 510a, and a first upper electrode 550a is formed on the first organic emission layer 530a. The first upper electrode 550a is a transparent electrode, and a thin metal layer having a low work function, for example, Mg, Ca, Al, Ag, Ba, or an alloy thereof, is used to form the first upper electrode having a thickness of 100 Å or less when it is a cathode. Forming the first upper electrode 550a may further include forming an ITO layer on the thin metal layer. As a result, at least one first OLED 570a is formed in the first display portion (a).

Next, at least one first lower electrode 510b is formed on the bottom surface 502 of the substrate 500 in the second display portion (b). The first lower electrode 510b is a reflective electrode, and, for example, Ag, Al, Ni, Pt, or Pd is used for the first lower electrode when it is an anode. A first organic emission layer 530b is formed on the first lower electrode 510b, and a first upper electrode 550b is formed on the first organic emission layer 530b. The first upper electrode 550b is made of a transparent electrode, and a thin metal layer having a low work function, for example, Mg, Ca, Al, Ag, Ba, or an alloy thereof, is used to form the first upper electrode having a thickness of 100 Å or less when it is a cathode. Forming the first upper electrode 550b may further include forming an ITO layer on the thin metal layer. As a result, at least one second OLED 570b is formed in the second display portion (b).

Alternatively, the lower electrodes 510a and 510b are formed in the first display portion (a) and the second display portion (b), respectively, and the organic emission layers 530a and 530b are formed on the lower electrodes 510a and 510b, respectively, and then the upper electrodes 550a and 550b are formed on the organic emission layers 530a and 530b, respectively, so that the first OLED 570a and the second OLED 570b are formed.

The OLEDs 570a and 570b may be bottom-emission types in which the lower electrodes 510a and 510b are reflective electrodes and the upper electrodes 550a and 550b are transparent electrodes to emit light in a direction away from the substrate. However, the first OLED 570a maybe formed on the top surface 501 of the substrate while the second OLED 570b may be formed on the bottom surface 502 of the substrate to thereby fabricate a flat panel display for emitting light in directions opposite to each other. Accordingly, the substrate 500 may be used to display both screens, namely, in a direction toward the substrate and in a direction away from the substrate, and the first OLED 570a or the second OLED 570*b* is not driven when one screen is displayed in any one of the directions, thereby reducing power consumption.

Furthermore, the OLEDs 570*a* and 570*b* may be passive matrix types or active matrix types. When the OLEDs 570*a* and 570*b* are active matrix types, the substrate 500 has thin film transistors to be electrically connected to the lower electrodes 510*a* and 510*b*, respectively.

Figure 7:
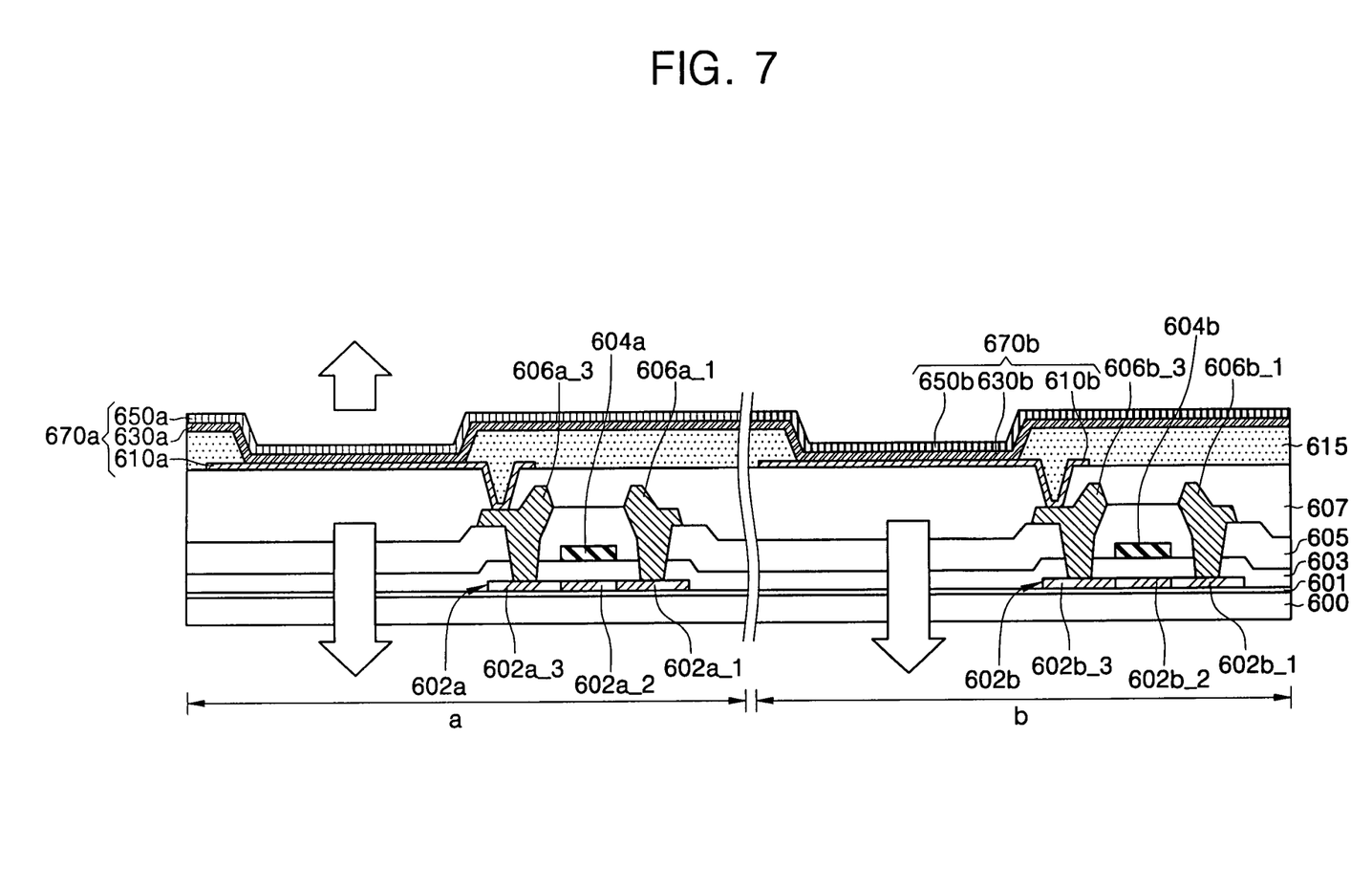
FIGS. 7 to 9 are cross-sectional views illustrating a method for fabricating a flat panel display in accordance with the sixth to eighth embodiments of the present invention, respectively.

FIG. 7 is a cross-sectional view illustrating a method for fabricating a flat panel display in accordance with the sixth embodiment of the present invention. The flat panel display in accordance with the sixth embodiment is fabricated to include a transparent OLED and a bottom-emission OLED on one substrate.

Referring to FIG. 7, a transparent substrate 600 having a first display portion (a) and a second display portion (b) is provided. The transparent substrate 600 may be a glass substrate or a plastic substrate. A buffer layer 601 may be formed on the transparent substrate 600. The buffer layer 601 may be formed of a silicon oxide layer, a silicon nitride layer, a silicon oxynitride layer, or a stacked layer thereof.

A first semiconductor layer 602*a* and a second semiconductor layer 602*b* are formed on the buffer layer 601 of the first display portion (a) and the second display portion (b), respectively. Formation of the semiconductor layers 602*a* and 602*b* may be carried out by depositing an amorphous silicon layer on the buffer layer 601, crystallizing the amorphous silicon layer to form a polycrystalline silicon layer, and patterning the polycrystalline silicon layer. The crystallization may be carried out by employing a solid phase crystallization (SPC) method, an excimer laser annealing (ELA) method, a sequential lateral solidification (SLS) method, a metal induced crystallization (MIC), or a metal induced lateral crystallization (MILC) method.

A gate insulating layer 603 is formed on the semiconductor layers 602*a* and 602*b*. The gate insulating layer 603 may be formed of a silicon oxide layer, a silicon nitride layer, a silicon oxynitride layer, or a stacked layer thereof. A gate conductive layer is deposited on the gate insulating layer 603, and the gate conductive layer is patterned to thereby form a first gate electrode 604*a* and a second gate electrode 604*b* which overlap with the first and second semiconductor layers 602*a* and 602*b*, respectively.

Impurities are implanted into the semiconductor layers 602*a* and 602*b* using the gate electrodes 604*a* and 604*b* as a mask to form first source region 602*a*_1 and first drain region 602*a*_2 in the first semiconductor layer 602*a*, and second source region 602*b*_1 and second drain region 602*b*_2 in the second semiconductor layer 602*b*. As a result, a first channel region 602*a*_2 is defined between the first source and drain regions 602*a*_1 and 602*a*_2, respectively, and a second channel region 602*b*_2 is defined between the second source and drain regions 602*b*_1 and 602*b*_2, respectively.

Next, an interlayer 605 is formed on the gate electrodes 604*a* and 604*b*. First contact holes for exposing the first source and drain regions 602*a*_1 and 602*a*_2, respectively, and second contact holes for exposing the second source and drain regions 602*b*_1 and 602*b*_2, respectively, are formed within the interlayer 605. A source/drain conductive layer is deposited on the substrate on which contact holes are already formed, and is patterned to thereby form first source electrode 606*a*_1 first drain electrode 606*a*_3, second source electrode 606*b*_1, and second drain electrode 606*b*_3. The first source and drain electrodes 606*a*_1 and 606*a*_3, respectively, are connected to the first source and drain regions 602*a*_1 and 602*a*_3, respectively, through the first contact holes. The second source and drain electrodes 606*b*_1 and 606*b*_3, respectively, are connected to the second source and drain regions 602*b*_1 and 602*b*_3, respectively, through the second contact holes. The first semiconductor layer 602*a*, the first gate electrode 604*a*, and the first source and drain electrodes 606*a*_1 and 606*a*_3, respectively, form a first thin film transistor, and the second semiconductor layer 602*b*, the second gate electrode 604*b*, and the second source and drain electrodes 606*b*_1 and 606*b*_3, respectively, form a second thin film transistor.

A passivation layer 607 is then formed on the source electrodes 606*a*_1 and 606*b*_1 and drain electrodes 606*a*_3 and 606*b*_3. A first via hole for exposing the first drain electrode. 606*a*_3, and a second via hole for exposing the second drain electrode 606*b*_3, are formed within the passivation layer 607.

A first lower electrode 610*a* connected to the first drain electrodes 606*a*_3 through the first via hole, and a second lower electrode 610*b* connected to the second drain electrodes 606*b*_3 through the second via hole, are formed on the passivation layer 607. The lower electrodes 610*a* and 610*b* are transparent electrodes, and, for example, ITO or IZO is used for the lower electrodes when they are anodes.

A pixel defining layer 615 is formed on the first and second lower electrodes 610*a* and 610*b*, respectively, so as to have openings for exposing the first and second lower electrodes 610*a* and 610*b*, respectively. First and second organic emission layers 630*a* and 630*b*, respectively, are formed on the first and second lower electrodes 610*a* and 610*b*, respectively, exposed within the openings. First and second upper electrodes 650*a* and 650*b*, respectively, are formed on the first and second organic emission layers 630*a* and 630*b*, respectively. The first upper electrode 650*a* is a transparent electrode, and a thin metal layer having a low work function, for example, Mg, Ca, Al, Ag, Ba, or an alloy thereof, is used to form the first upper electrode having a thickness of 100 Å or less when it is a cathode. Formation of the first upper electrode 650*a* may further include forming an ITO layer on the thin metal layer. The second upper electrode 650*b* is a reflective electrode, and a metal layer having a low work function, for example, Mg, Ca, Al, Ag, Ba, or an alloy thereof, is used to form the second upper electrode having a thickness of 500 Å or more when it is a cathode. The first upper electrode 650*a* as the transparent electrode and the second upper electrode 650*b* as the reflective electrode may each be formed using a shadow mask or the like.

Accordingly, at least one first OLED 670*a* and at least one second OLED 670*b* are formed in the first display portion (a) and the second display portion (b), respectively. The first OLED 670*a* is a transparent OLED in which the first lower electrode 610*a* and the first upper electrode 650*a* are transparent electrodes to emit light in a direction toward the substrate and in a direction away from the substrate, and the second OLED 670*b* is a bottom-emission type in which the second lower electrode 610*b* is a transparent electrode and the second upper electrode 650*b* is a reflective electrode to emit light only in a direction toward the substrate.

Furthermore, the first OLED 670*a* and the second OLED 670*b*, in particular, the first lower electrode 610*a* and the second lower electrode 610*b*, are electrically connected to the first and second thin film transistors, respectively. In addition, gate driving circuits and data driving circuits shown in FIG. 1 may be formed while forming the thin film transistors.

Figure 8:
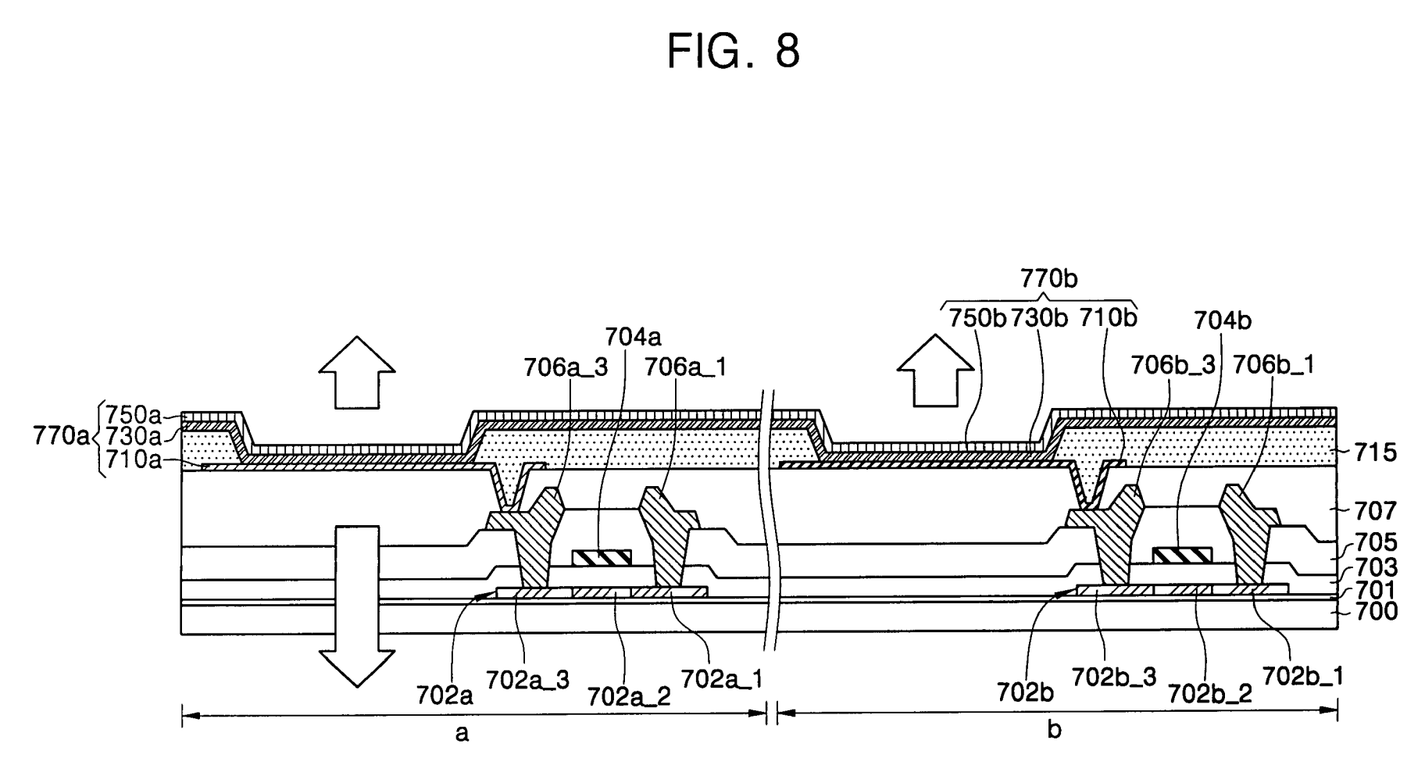

FIG. 8 is a cross-sectional view illustrating a method for fabricating a flat panel display in accordance with the seventh embodiment of the present invention. The flat panel display in accordance with the seventh embodiment is fabricated to include a transparent OLED and a top-emission OLED on one substrate, and is the same as that of the above-mentioned sixth embodiment except for the following description.

Referring to FIG. 8, a transparent substrate 700 having a first display portion (a) and a second display portion (b) is provided. A buffer layer 701 is formed on the transparent substrate 700, and a first semiconductor layer 702a and a second semiconductor layer 702b are formed on the buffer layer 701. A gate insulating layer 703 is formed on the semiconductor layers 702a and 702b, and a first gate electrode 704a and a second gate electrode 704b are formed on the gate insulating layer 703. Impurities are implanted into the semiconductor layers 702a and 702b using the gate electrodes 704a and 704b as a mask, so that first source region 702a_1 and first drain region 702a_3 are formed in the first semiconductor layer 702a, and second source region 702b_1 and first drain region 702b_3 are formed in the second semiconductor layer 702b while a first channel region 702a_2 and a second channel region 702b_2 are simultaneously defined.

Next, an interlayer 705 is formed on the gate electrodes 704a and 704b. First source and drain electrodes 706a_1 and 706a_3, respectively, connected to the first source and drain regions 702a_1 and 702a_3, respectively, and second source and drain electrodes 706b_1 and 706b_3, respectively, connected to the second source and drain regions 702b_1 and 702b_3, respectively, are formed on the interlayer 705. The first semiconductor layer 702a, the first gate electrode 704a, and the first source and drain electrodes 706a_1 and 706a_3, respectively, form a first thin film transistor, and the second semiconductor layer 702b, the second gate electrode 704b, and the second source and drain electrodes 706b_1 and 706b_3, respectively, form a second thin film transistor.

A passivation layer 707 is formed on the source electrodes 706a_1 and 706b_1 and drain electrodes 706a_3 and 706b_3. A first via hole for exposing the first drain electrode 706a_3 and a second via hole for exposing the second drain electrode 706b_3 are formed within the passivation layer 707.

A first lower electrode 710a connected to the first drain electrode 706a_3 through the first via hole, and second lower electrode 710b connected to the second drain electrode 706b_3 through the second via hole, are formed on the passivation layer 707. The first lower electrode 710a is a transparent electrode, and, for example, ITO or IZO is used for the first lower electrode when it is an anode. The second lower electrode 710b is a reflective electrode, and, for example, Ag, Al, Ni, Pt, Pd, or an alloy thereof is used for the second lower electrode when it is an anode. Formation of the first lower electrode 710a and the second lower electrode 710b of different respective materials may be carried out by repeatedly performing patterning using photoresist and deposition, or by deposition using a shadow mask.

A pixel defining layer 715 is formed on the first and second lower electrodes 710a and 710b, respectively so as to have openings for exposing the first and second lower electrodes 710a and 710b, respectively. A first organic emission layer 730a and a second organic emission layer 730b are formed on the first and second lower electrodes 710a and 710b, respectively, exposed within the openings. First and second upper electrodes 750a and 750b, respectively, are formed on the first and second organic emission layers 730a and 730b, respectively. The upper electrodes 750a and 705b are made of transparent electrodes, and a thin metal layer having a low work function, for example, Mg, Ca, Al, Ag, Ba, or an alloy thereof, is used to form the upper electrodes having a thickness of 100 Å or less when they are cathodes. Formation of the upper electrodes 750a and 750b may further include forming an ITO layer on the thin metal layer.

Accordingly, at least one first OLED 770a and at least one second OLED 770b are formed in the first display portion (a) and the second display portion (b), respectively. The first OLED 770a is a transparent OLED in which the first lower electrode 710a and the first upper electrode 750a are transparent electrodes to emit light in a direction toward the substrate and in a direction away from the substrate, and the second OLED 770b is a top-emission type in which the second lower electrode 710b is a reflective electrode and the second upper electrode 750b is a transparent electrode to emit light in a direction away from the substrate.

Furthermore, the first OLED 770a and the second OLED 770b, in particular, the first lower electrode 710a and the second lower electrode 710b, are electrically connected to the first and second thin film transistors, respectively. In addition, gate driving circuits and data driving circuits shown in FIG. 1 may be formed while forming the thin film transistors.

Figure 9:
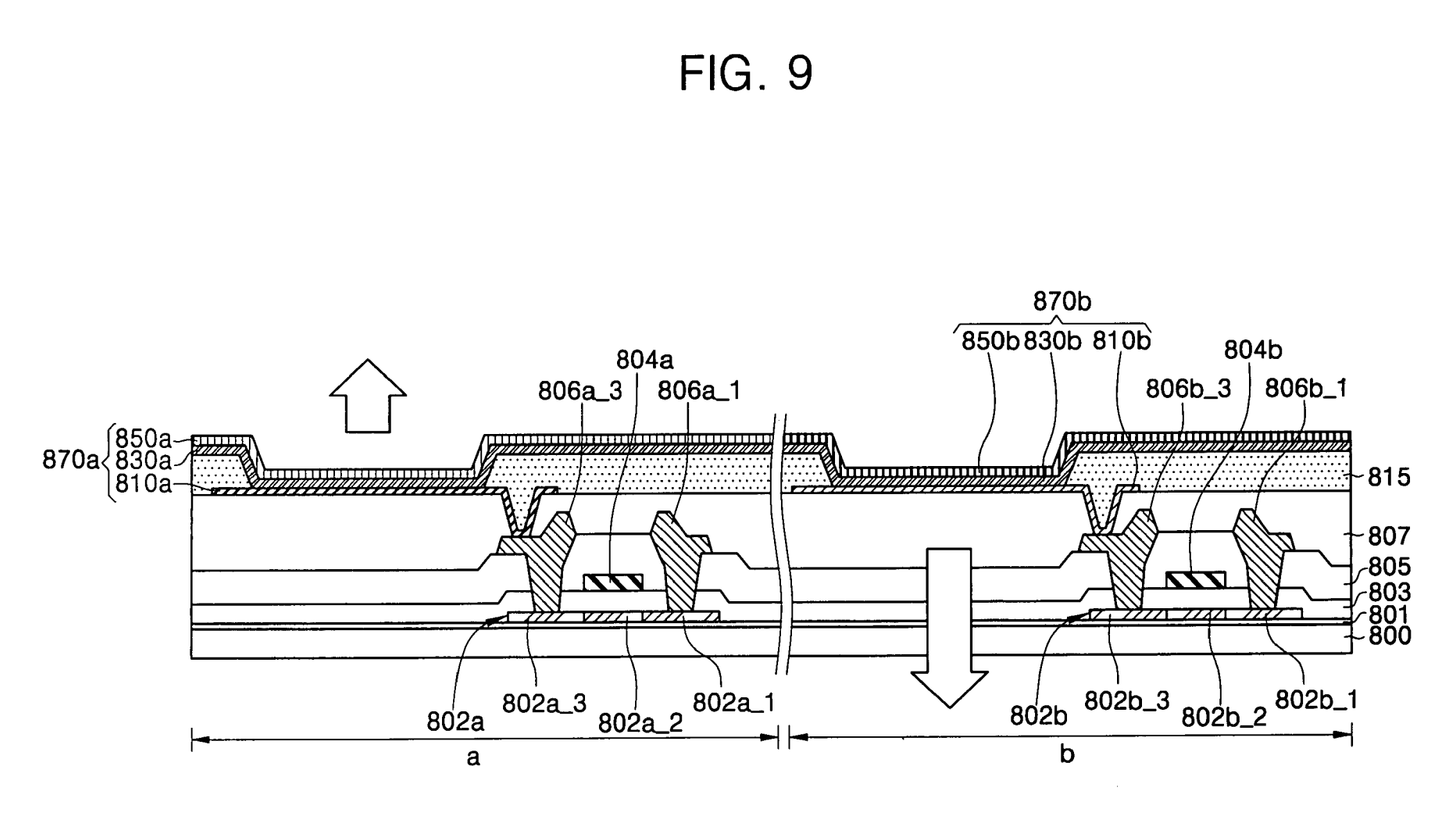

FIG. 9 is a cross-sectional view illustrating a method for fabricating a flat panel display in accordance with the eighth embodiment of the present invention. The flat panel display in accordance with the eighth embodiment is fabricated to include a top-emission OLED and a bottom-emission OLED on one substrate, and is substantially the same as that of the above-mentioned sixth embodiment except for the following description.

Referring to FIG. 9, a transparent substrate 800 having a first display portion (a) and a second display portion (b) is provided. A buffer layer 801 is formed on the transparent substrate 800, and a first semiconductor layer 802a and a second semiconductor layer 802b are formed on the buffer layer 801. A gate insulating layer 803 is formed on the semiconductor layers 802a and 802b, and a first gate electrode 804a and a second gate electrode 804b are formed on the gate insulating layer 803. Impurities are implanted into the semiconductor layers 802a and 802b using the gate electrodes 804a and 804b as a mask, so that first source region 802a_1 and first drain region 802a_3 are formed in the first semiconductor layer 802a, and second source region 802b_1 and second drain region 802b_3 are formed in the second semiconductor layer 802b while a first channel region 802a_2 and a second channel region 802b_2 are simultaneously defined.

Next, an interlayer 805 is formed on the gate electrodes 804a and 804b. First source electrode 806a_1 and first drain electrode 806a_3 connected to the first source and drain regions 802a_1 and 802a_3, respectively, and second source electrode 806b_1 and second drain electrode 806b_3 connected to the second source and drain regions 802b_1 and 802b_3, respectively, are formed on the interlayer 805. The first semiconductor layer 802a, the first gate electrode 804a, and the first source and drain electrodes 806a_1 and 806a_3, respectively, form a first thin film transistor, and the second semiconductor layer 802b, the second gate electrode 804b, and the second source and drain electrodes 806b_1 and 806b_3, respectively, form a second thin film transistor.

A passivation layer 807 is formed on the source electrodes 806a_1 and 806b_1 and drain electrodes 806a_3 and 806b_3. A first via hole for exposing the first drain electrode 806a_3 and a second via hole for exposing the second drain electrode 806b_3 are formed within the passivation layer 807.

A first lower electrode 810a connected to the first drain electrode 806a_3 through the first via hole, and second lower electrode 810b connected to the second drain electrode 806b_3 through the second via hole, are formed on the passivation layer 807. The first lower electrode 810a is a reflective electrode, and, for example, Ag, Al, Ni, Pt, or Pd is used for first the lower electrode when it is an anode. The second lower electrode 810b is a transparent electrode, and, for example, ITO or IZO is used for the second lower electrode when it is an anode. As such, formation of the first lower electrode 810a and the second lower electrode 810b of respective different respective materials may be carried out by repeatedly performing patterning using photoresist and deposition, or by deposition using a shadow mask.

A first organic emission layer 830a and a second organic emission layer 830b are formed on the first and second lower electrodes 810a and 810b, respectively. First and second upper electrodes 850a and 850b, respectively, are formed on the first and second organic emission layers 830a and 830b, respectively. The first upper electrode 850a is a transparent electrode, and a thin metal layer having a low work function, for example, Mg, Ca, Al, Ag, Ba, or an alloy thereof, is used to form the first upper electrode having a thickness of 100 Å or less when it is a cathode. Formation of the first upper electrode 850a may further include forming an ITO layer on the thin metal layer. The second upper electrode 850b is a reflective electrode, and a metal layer having a low work function, for example, Mg, Ca, Al, Ag, Ba, or an alloy thereof, is used to form the second upper electrode having a thickness of 500 Å or more when it is a cathode. The first upper electrode 850a as the transparent electrode and the second upper electrode 850b as the reflective electrode are formed using a shadow mask or the like, respectively.

Accordingly, at least one first OLED 870a and at least one second OLED 870b are formed in the first display portion (a) and the second display portion (b), respectively. The first OLED 870a is a top-emission type in which the first lower electrode 810a is a reflective electrode and the first upper electrode 850a is a transparent electrode to emit light in a direction away from the substrate, and the second OLED 870b is a bottom-emission type in which the second lower electrode 810b is a transparent electrode and the second upper electrode 850b is a reflective electrode to emit light in a direction toward the substrate.

Furthermore, the first OLED 870a and the second OLED 870b, in particular, the first lower electrode 810a and the second lower electrode 810b, are electrically connected to the first and second thin film transistors, respectively. In addition, gate driving circuits and data driving circuits shown in FIG. 1 may be formed while forming the thin film transistors.

Figure 10:
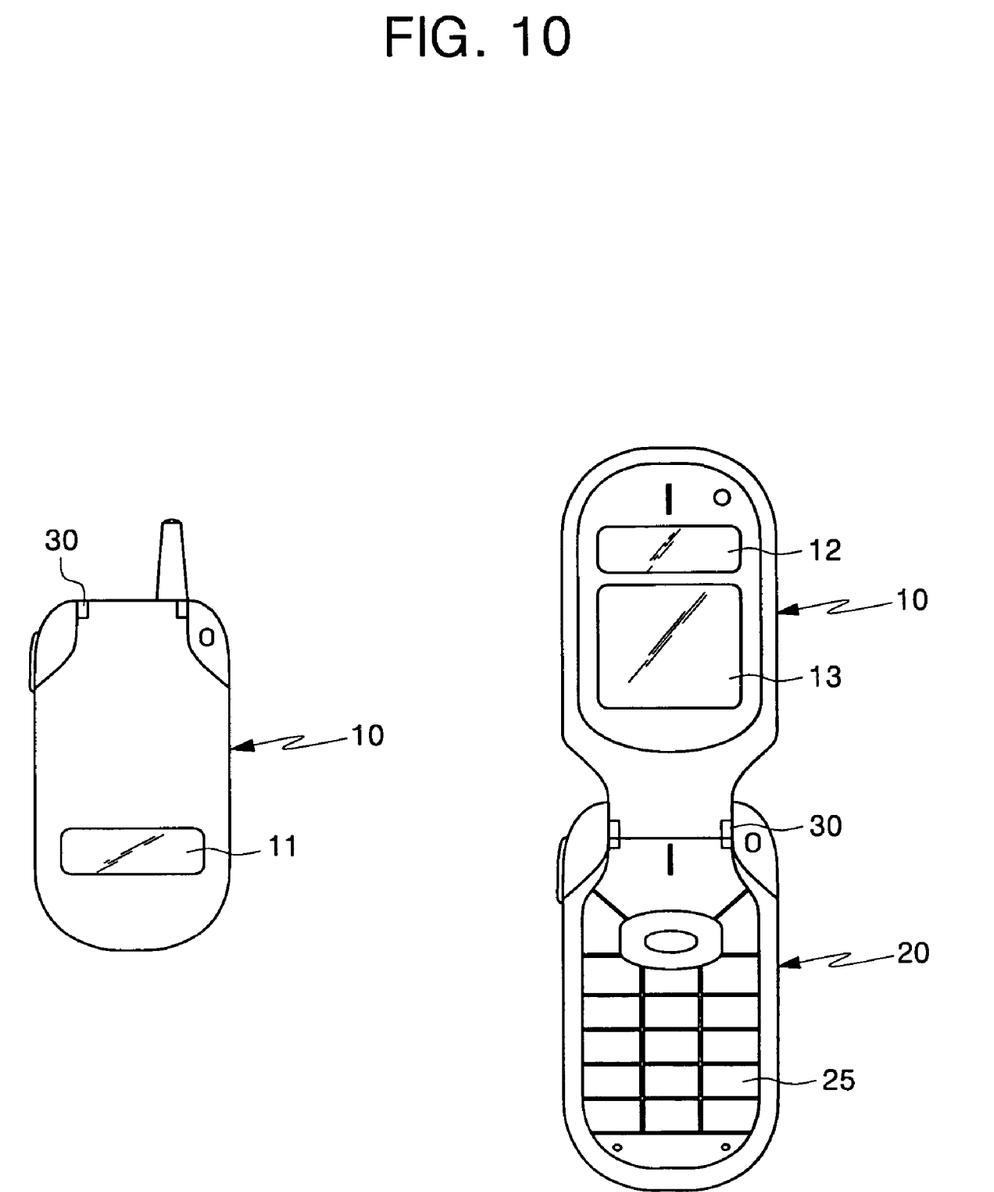
FIG. 10 is a plan view illustrating a folder type mobile phone in the folded and unfolded states and employing the flat panel display in accordance with any one of the first, second, sixth, and seventh embodiments of the present invention.

FIG. 10 is a plan view illustrating a folder type mobile phone in the folded and unfolded states employing the flat panel display in accordance with any one of the first, second, sixth and seventh embodiments of the present invention.

Referring to FIG. 10, the mobile phone comprises a cover 10 and a main body 20, input buttons 25 are arranged on the main body 20, and the cover 10 and the main body 20 are connected to each other by an interconnection portion 30. The cover 10 has an external screen 11 on its external surface, and has a first internal screen 12 and a second internal screen 13 on its internal surface. In this case, the external screen 11 is positioned to correspond to the first internal screen 12. The first OLED (170a of FIG. 2, 270a of FIG. 3, 670a of FIG. 7, and 770a of FIG. 8), which is a transparent OLED positioned in the first display portion (a) of the flat panel display in accordance with the first, second, sixth or seventh embodiment, displays screens through the external screen 11 and the first internal screen 12. The second OLED (170b of FIG. 2, 270b of FIG. 3, 670b of FIG. 7, and 770b of FIG. 8), which is a top-emission type or a bottom-emission type positioned in the second display portion (b) of the flat panel display in accordance with the first, second, sixth or seventh embodiment, displays the screen through the second internal screen 13.

As such, the flat panel display in accordance with the first, second, sixth or seventh embodiment may display screens on both sides using one substrate so that the thickness of the folder type mobile phone employing the flat panel display may be reduced. The second OLED (170b of FIG. 2, 270b of FIG. 3, 670b of FIG. 7, and 770b of FIG. 8), namely, the second internal screen 13, is not allowed to display when the first OLED (170a of FIG. 2, 270a of FIG. 3, 670a of FIG. 7, and 770a of FIG. 8), namely, the external screen 11, is displayed so that power consumption of the mobile phone may be reduced. In addition to being applied to the above-mentioned mobile phone, the flat panel display of the present invention may also be applied to electronic equipment for displaying screens on both sides through internal and external screens so as to obtain the same effect.

Figure 11:
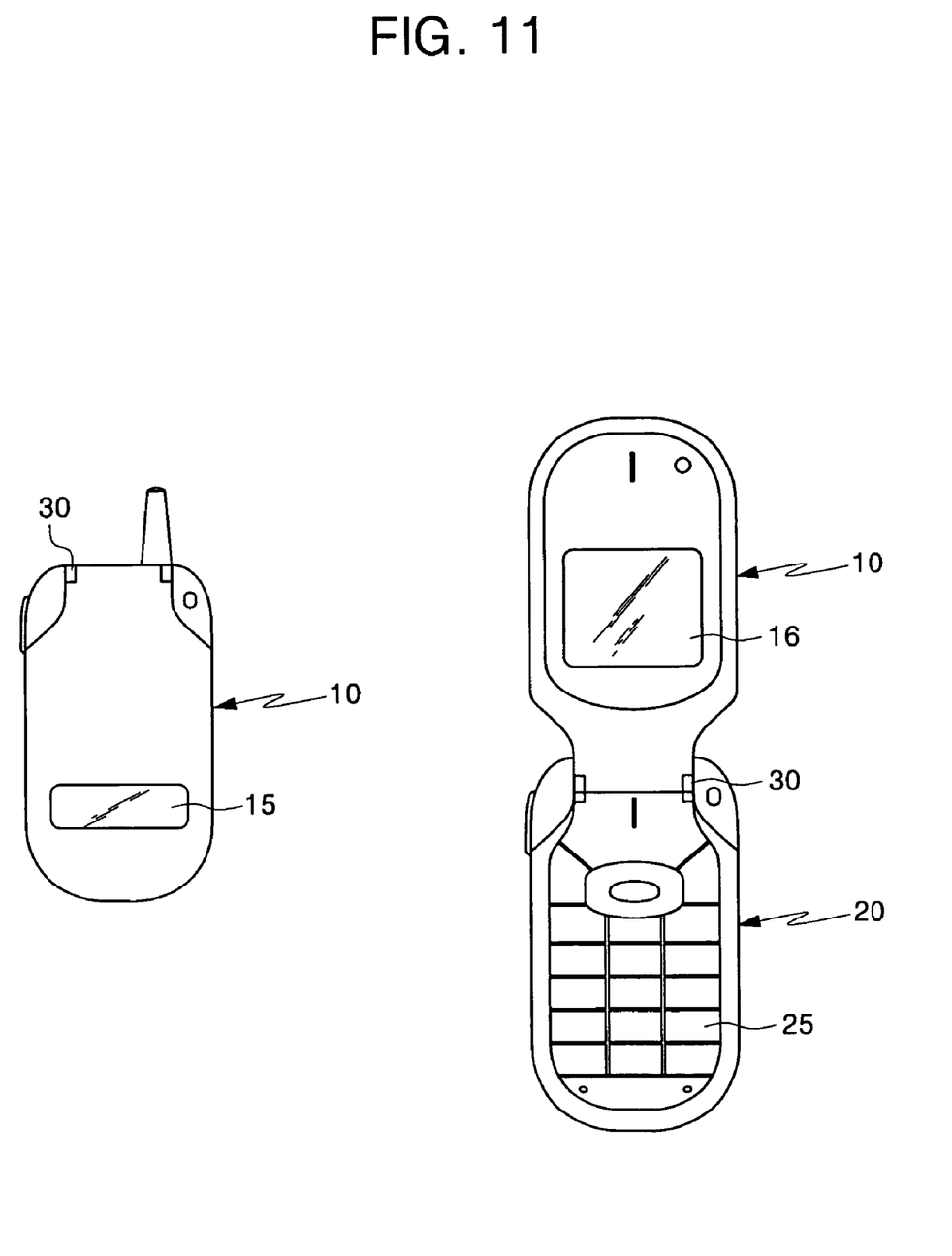
FIG. 11 is a plan view illustrating a folder type mobile phone in the folded and unfolded states and employing the flat panel display in accordance with any one of the third to fifth, and eighth embodiments of the present invention.

FIG. 11 is a plan view illustrating a folder type mobile phone in the folded and unfolded states employing the flat panel display in accordance with any one of the third, fourth, fifth and eighth embodiments of the present invention.

Referring to FIG. 11, the mobile phone comprises a cover 10 and a main body 20, input buttons 25 are arranged on the main body 20, and the cover 10 and the main body 20 are connected to each other by an interconnection portion 30. The cover 10 has an external screen 15 on its external surface, and has an internal screen 16 on its internal surface. The first OLED (370a of FIG. 4, 470a of FIG. 5, 570a of FIG. 6, and 870a of FIG. 9), which is positioned in the first display portion (a) of the flat panel display in accordance with the third, fourth, fifth or eighth embodiment, displays the screen through the external screen 15. The second OLED (370b of FIG. 4, 470b of FIG. 5, 570b of FIG. 6, and 870b of FIG. 9), which is positioned in the second display portion (b) of the flat panel display in accordance with the third, fourth, fifth or eighth embodiment, displays the screen through the internal screen 16.

As such, the flat panel display in accordance with the third, fourth, fifth or eighth embodiment may display screens on both sides using one substrate so that the thickness of the folder type mobile phone employing the flat panel display may be reduced. However, the screens are not displayed on both sides at the same time. The second OLED (370b of FIG. 4, 470b of FIG. 5, 570b of FIG. 6, and 870b of FIG. 9), namely, the internal screen 16, is not allowed to be displayed when the first OLED (370a of FIG. 4, 470a of FIG. 5, 570a of FIG. 6, and 870a of FIG. 9), namely, the external screen 15, is displayed so that power consumption of the mobile phone may be reduced. In addition to being applied to the above-mentioned mobile phone, the flat panel display of the present invention may also be applied to electronic equipment for displaying screens on both sides through the internal and external screens to obtain the same effect.

As mentioned above, in accordance with the present invention, a flat panel display is fabricated so that one substrate is used to display the screens on both sides, and one of the sides is displayed while the other is not allowed to be displayed. Accordingly, the thickness of the electronic equipment employing the flat panel display may be reduced, and power consumption of the electronic equipment may also be reduced.

Although the present invention has been described with reference to certain exemplary embodiments thereof, it will be understood by those skilled in the art that a variety of modifications and variations may be made to the present invention without departing from the spirit or scope of the present invention as defined in the appended claims, and their equivalents.

What is claimed is:

1. A flat panel display, comprising:
a transparent substrate having a first display portion and a second display portion;
at least one first organic light emitting diode positioned in the first display portion for emitting light in at least a first direction perpendicular to the transparent substrate, and having a first lower electrode, a first upper electrode, and a first organic emission layer interposed between the first lower electrode and the first upper electrode; and
at least one second organic light emitting diode positioned in the second display portion for emitting light in a second direction opposite to the first direction, and having a second lower electrode, a second upper electrode, and a second organic emission layer interposed between the second lower electrode and the second upper electrode;
wherein both the first lower electrode and the first upper electrode comprise transparent electrodes, the second lower electrode comprises a transparent electrode, and the second upper electrode comprises a reflective electrode.

2. The flat panel display as recited in claim 1, wherein said at least one first organic light emitting diode and said at least one second organic light emitting diode are positioned on a same surface of the transparent substrate.

3. The flat panel display as recited in claim 1, wherein said at least one first organic light emitting diode is positioned on a surface opposite to a surface on which said at least one second organic light emitting diode is positioned.

4. The flat panel display as recited in claim 1, further comprising:
a first thin film transistor electrically connected to said at least one first organic light emitting diode; and
a second thin film transistor electrically connected to said at least one second organic light emitting diode.

5. The flat panel display as recited in claim 4, wherein said at least one first organic light emitting diode and said at least one second organic light emitting diode are positioned on a same surface of the transparent substrate.

6. The flat panel display as recited in claim 1, wherein the flat panel display is used for a folder type mobile phone.

7. A flat panel display comprising:
a transparent substrate having a first display portion and a second display portion;
at least one first organic light emitting diode positioned in the first display portion for emitting light in at least a first direction perpendicular to the transparent substrate, and having a first lower electrode, a first upper electrode, and a first organic emission layer interposed between the first lower electrode and the first upper electrode; and
at least one second organic light emitting diode positioned in the second display portion for emitting light in a second direction opposite to the first direction, and having a second lower electrode, a second upper electrode, and a second organic emission layer interposed between the second lower electrode and the second upper electrode;
wherein both the first lower electrode and the first upper electrode comprise transparent electrodes, the second lower electrode comprises a reflective electrode, and the second upper electrode comprises a transparent electrode.

8. The flat panel display as recited in claim 7, wherein said at least one first organic light emitting diode and said at least one second organic light emitting diode are positioned on a same surface of the transparent substrate.

9. The flat panel display as recited in claim 7, wherein said at least one first organic light emitting diode is positioned on a surface opposite to a surface on which said at least one second organic light emitting diode is positioned.

10. The flat panel display as recited in claim 7, further comprising:
a first thin film transistor electrically connected to said at least one first organic light emitting diode; and
a second thin film transistor electrically connected to said at least one second organic light emitting diode.

11. The flat panel display as recited in claim 10, wherein said at least one first organic light emitting diode and said at least one second organic light emitting diode are positioned on a same surface of the transparent substrate.

12. The flat panel display as recited in claim 7, wherein the flat panel display is used for a folder type mobile phone.

* * * * *